(12) United States Patent
Ito

(10) Patent No.: US 6,573,508 B1
(45) Date of Patent: Jun. 3, 2003

(54) ELECTRON BEAM EXPOSING METHOD

(75) Inventor: Hiroyuki Ito, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/575,849

(22) Filed: May 19, 2000

(30) Foreign Application Priority Data

May 20, 1999 (JP) .......................................... 11-139656

(51) Int. Cl.$^7$ .......................... G01N 23/00; G01K 7/00; G21G 5/00; A61N 5/00
(52) U.S. Cl. .................. 250/396 R; 250/396; 250/196; 250/306; 250/307; 250/311; 250/492.2; 250/492.3
(58) Field of Search ........................... 250/491.1, 492.2, 250/492.23, 441.1, 297, 397, 396 R, 310, 311, 396 ML, 492.1, 292.3, 492.22

(56) References Cited

U.S. PATENT DOCUMENTS

| | | | | | |
|---|---|---|---|---|---|
| 3,857,041 A | * | 12/1974 | Spicer | .................... | 219/121.12 |
| 4,524,277 A | * | 6/1985 | Shimura et al. | ......... | 250/396 R |
| 5,438,207 A | * | 8/1995 | Itoh et al. | ................ | 250/491.1 |
| 5,929,454 A | * | 7/1999 | Muraki et al. | ............ | 250/491.1 |
| 6,093,511 A | * | 7/2000 | Tanaka et al. | ............ | 250/491.1 |
| 6,147,355 A | * | 11/2000 | Ando et al. | ............... | 250/491.1 |
| 6,207,962 B1 | * | 3/2001 | Okino | ..................... | 250/492.1 |
| 6,335,532 B1 | * | 1/2002 | Tanaka et al. | ............... | 250/310 |
| 6,362,489 B2 | * | 3/2002 | Okino | ..................... | 250/396 R |
| 6,403,971 B1 | * | 6/2002 | Kawata | ................... | 250/491.1 |
| 2002/0036272 A1 | * | 3/2002 | Okino | ..................... | 250/491.1 |

FOREIGN PATENT DOCUMENTS

JP 6236841 A 8/1994
JP 10-163089 A 6/1998

* cited by examiner

Primary Examiner—John R. Lee
Assistant Examiner—Bernard Souw
(74) Attorney, Agent, or Firm—Kenyon & Kenyon

(57) ABSTRACT

In order to provide an electron beam exposure apparatus and an exposing method using an electron beam that realizes highly precise pattern exposure, an axis difference generated by the variable shaping operation, transcription distortion or location difference in the dimensional change of said beam is prevented by measuring an axis difference to high accuracy and by adjusting a shaping lens when an adjusting parameter or a shaping aperture of a lens is changed and beam dimension is changed. Thereby, a beam adjusting method which is capable of achieving high resolution of the electron beam exposure apparatus of a variable shaping type can be offered.

3 Claims, 4 Drawing Sheets

ELECTRON BEAM EXPOSING METHOD

BACKGROUND OF THE INVENTION

The present invention relates to an electron beam exposure apparatus which is used in a manufacturing process of a semiconductor device and an exposing method using an electron beam, and especially relates to an electron beam axis adjustment of a variable shaping type electron beam exposure apparatus.

An electron beam exposure apparatus is used as a lithography apparatus for forming a circuitry pattern of an original mask, used in an exposure process of the semiconductor device or fordirectly forming a circuitry pattern on a silicon wafer substrate.

In the exposing method of the electron beam exposure apparatus, there are a raster-scan system for shaping a pattern by scanning a surface of the sample while the electronic source is reduced and the electron beam is switched on and off, a variable shaping system for generating a variable rectangular beam, by shaping, with plural rectangular apertures, the electron beam generated from a electronic source and by scanning this shaped rectangular aperture image with a deflector, and a partial batch exposure system to repeatedly shape figures on a transfer mask beforehand and to irradiate the electron beam so as to expose with a high reduction rate, as an improved one of more variable formation system. Especially as compared with a raster-scan system, since the variable shaping system exposes a whole figure, having a big area, the number of shots can be significantly reduced, and speedup becomes possible. However, since in a variable shaping system, a complicated electron optics system apparatus, such as a beam shaping deflection system, is necessary, there is a problem that a beam axis difference occurs in the variable shaping deflection.

FIG. 1 is a perspective view showing a brief construction of the electron beam exposure apparatus, and FIG. 2 is a partial enlarged view of FIG. 1 to show a locus of the electron beam. The electron beam exposure apparatus shown by FIG. 1 is operated with a variable shaping system, and in FIG. 2, a focal (or image) location of an electron source is shown with a circle (it appears as an ellipse because it is show in the perspective view), and a image location of the shaping aperture is shown by arrows. In other words, the electronic source 1 and an electronic source image 24 are shown by a circle and a shaping aperture image 25 is shown by the arrows.

Generally, the shaping aperture is reduced about one to a dozen times with a reducing lens, and the electron source image is magnified a corresponding number of times. The first shaping aperture image is focused on the second shaping aperture with a shaping lens, a shaping deflector moves the first shaping aperture image, and controls a beam shape transmitting the second shaping aperture. Here, an electronic source image is focused on the center of the shaping deflector, and an imperfect axis alignment of the electron source image occurring due to a lower lens should be prevented in the operation of the shaping deflector. In other words, if the condition of the shaping lens, the location of the aperture, the beam axis etc. include an error, an imperfect axis alignment of the lower lens occurs, and there arises a bad influence in resolution or shot location precision when the shaping deflector is operated, that is, the dimension is varied.

As examples of an electron beam lithography device in which an imperfect axis alignment is adjusted by measuring a location difference of the electron beam, Japanese Patent Laid-open No. 6-236841 and Japanese Patent Laid-open No. 10-163089 are noted. However in these references, there is not any description of making the dispersion of the location difference a minimum by changing the focal point of the objective lens.

SUMMARY OF THE INVENTION

An objective of the present invention is to provide an electron beam exposure apparatus and a exposing method using an electron beam which realize [a] highly precise pattern lithography by preventing an imperfect axis alignment in the variable shaping operation.

In order to reach the above objective, in an electron beam exposure apparatus using a variable shaping system in an embodiment of the present invention, the imperfect axis alignment occurring when changing the beam dimension by varying an adjusting parameter of the lens or the shaping aperture, is measured to high accuracy so as to adjust the shaping lens, and a transcription distortion and location difference, appearing when the dimension changes, are prevented. Thereby, a beam adjusting method which is capable of achieving high resolution of the electron beam exposure apparatus of a variable shaping type can be offered.

That is, the electron beam exposure apparatus in accordance with an embodiment of the present invention comprises, an electron source for generating an electron beam, a first shaping aperture for shaping the electron beam, a shaping lens for projecting the electron beam that passes said first shaping aperture on a second shaping aperture, a shaping deflector for generating a shaped beam by deflecting the projection image from said first shaping aperture so as to shape a cross-section of the electron beam transmitting the second shaping aperture, a reducing lens for reducing said shaped beam generated with said shaping deflector, an objective lens for focusing said shaped beam image of the shaped beam reduced with said reducing lens on a sample surface, an objective deflector for deflecting said shaped beam to a desired location of said sample surface, a shaping axis adjusting deflector which is arranged on an upper shaping lens and controls an incidence angle of said electron beam to said shaping deflector, an objective axis adjusting deflector which is arranged between the second shaping aperture and the objective lens and controls said incidence angle of said shaped beam to said objective lens, a detector for detecting a reflected electron beam which is generated by scanning said sample surface with the shaped beam with said objective axis adjusting deflector, a deflector output value adjusting means for adjusting said various deflectors so as to obtain a minimum output value of deviation from said objective deflector, said shaping axis adjusting deflector and said objective axis adjusting deflector, by scanning said sample surface with plural different shaped beams using the second shaping aperture, and a shaping lens adjusting means for setting an adjusting parameter of the shaping lens so as to make dispersion of the location difference minimum by changing a focal point of said objective lens, by measuring a location on said sample surface of said shaped beam based on information from said detector, by measuring said location difference of said shaped beam before and after said changing, and by obtaining said dispersion of said location difference in said output value of respective ones of said deflectors corrected with said deflector output value adjusting means.

Furthermore, the electron beam exposure apparatus implemented as an embodiment of the present invention comprises, an electron source for generating an electron beam, an accelerating means for accelerating said electron beam, a first shaping aperture for shaping the electron beam, a shaping lens for projecting the electron beam that passed said first shaping aperture on a second shaping aperture, a shaping deflector for generating shaped beam by deflecting the projection image from said first shaping aperture so as to shape a cross-section of the electron beam transmitting the second shaping aperture, a reducing lens for reducing said shaped beam generated with said shaping deflector, an objective lens for focusing said shaped beam image of the shaped beam reduced with said reducing lens on a sample surface, an objective deflector for deflecting said shaped beam to a desired location of said sample surface, a shaping axis adjusting deflector which is arranged on an upper shaping lens and controls an incidence angle of said electron beam to said shaping deflector, an objective axis adjusting deflector which is arranged between the second shaping aperture and the objective lens and controls said incidence angle of said shaped beam to said objective lens, a detector for detecting a reflected electron beam which is generated by scanning said sample surface with the shaped beam with said objective axis adjusting deflector, a deflector output value adjusting means for adjusting said various deflectors so as to obtain a minimum output value of deviation from said objective deflector, said shaping axis adjusting deflector and said objective axis adjusting deflector, by scanning said sample surf ace with plural different shaped beams using the second shaping aperture, and a shaping lens adjusting means for setting an adjusting parameter of the shaping lens so as to make dispersion of the location difference minimum by changing a voltage applied to said accelerating means for accelerating said electron beam, by measuring a location on said sample surface of said shaped beam based on information from said detector, by measuring said location difference of said shaped beam before and after said changing, and by obtaining said dispersion of said location difference in said output value of respective said deflectors corrected with said deflector output value adjusting means.

Furthermore, the electron beam exposure apparatus implemented as an embodiment of the present invention comprises, a beam shaping means for generating an electron beam having an arbitrary cross-section by projecting said electron beam to several shaping apertures, a first detector for detecting a first reflected electron beam which is generated by scanning a reference mark on a sample with a shaped beam generated by said beam shaping means, a focal location shift means for shifting a shaft of said shaped beam from a focal location of a lens on a reference location of said shaped beam which is determined based on a first location information of said shaped beam provided with said first detector, a second detector for detecting a second reflected electron beam which is generated by scanning said reference mark on said sample with said shaped beam which is shifted an axis thereof with said focal location shift gateway, and a lens adjusting means for adjusting said lens, wherein a location difference of said shaped beam is measured based on a second location information of said shaped beam provided with said second detector, and an adjusting parameter for said lens is obtained in which dispersion of said location difference becomes minimum.

Furthermore, the electron beam exposure apparatus implemented as [the other] another embodiment of the present invention comprises [comprising], a lens adjusting means for changing said adjusting parameter of said lens based on a value of said location difference of the electron beam on said sample by changing said adjusting parameter of said lens.

DETAILED DESCRIPTION OF THE PREFERRED EMBODIMENTS

In general, when a beam axis corresponds to an electron lens axis, the beam is always located on the lens axis in spite of changes in lens strength. On the other hand, when the beam axis does not correspond to the electron lens axis, if the lens strength changes, the beam is moved in a predetermined direction from a central axis of the lens. For example, relating to a beam axis difference of an electromagnetic lens which is rotationally symmetry, the passage location of an electron beam in an axial perpendicular plane moves rotationally and is radiated in proportion to the amount of the axis difference and the lens intensity near a focal point on the lens axis. The shaping lens etc. are adjusted so that the beam position difference becomes minimum with changes in the lens strength when the shaping deflector is actuated.

The beam location difference can be detected with a high accuracy as follows. A beam dimension to be desired is obtained using a shaping deflector by fitting a beam focal point to a calibration mark having parallel arm in the X and Y directions on a sample stage with an objective lens. The beam reference position is obtained from a waveform etc. of a reflected electron beam by scanning the beam with the objective deflector in the X and Y directions. Then the objective lens focal location is changed within a range that a mark location is possible to be detected. A similar measurement as above is performed, and a location error from the reference location is obtained. For plural different beam dimension settings, the measurement is performed as above, and dispersion of the deviation is determined. For the variable amount needed to adjust these, that is, for the shaping lens setting parameter, a minimum value of the dispersion of the deviation is obtained.

The desired shaping lens setting becomes possible as described above, and instead of changing the objective lens intensity, it is possible to change the accelerating voltage so as to measure a beam position difference.

Figure 1:
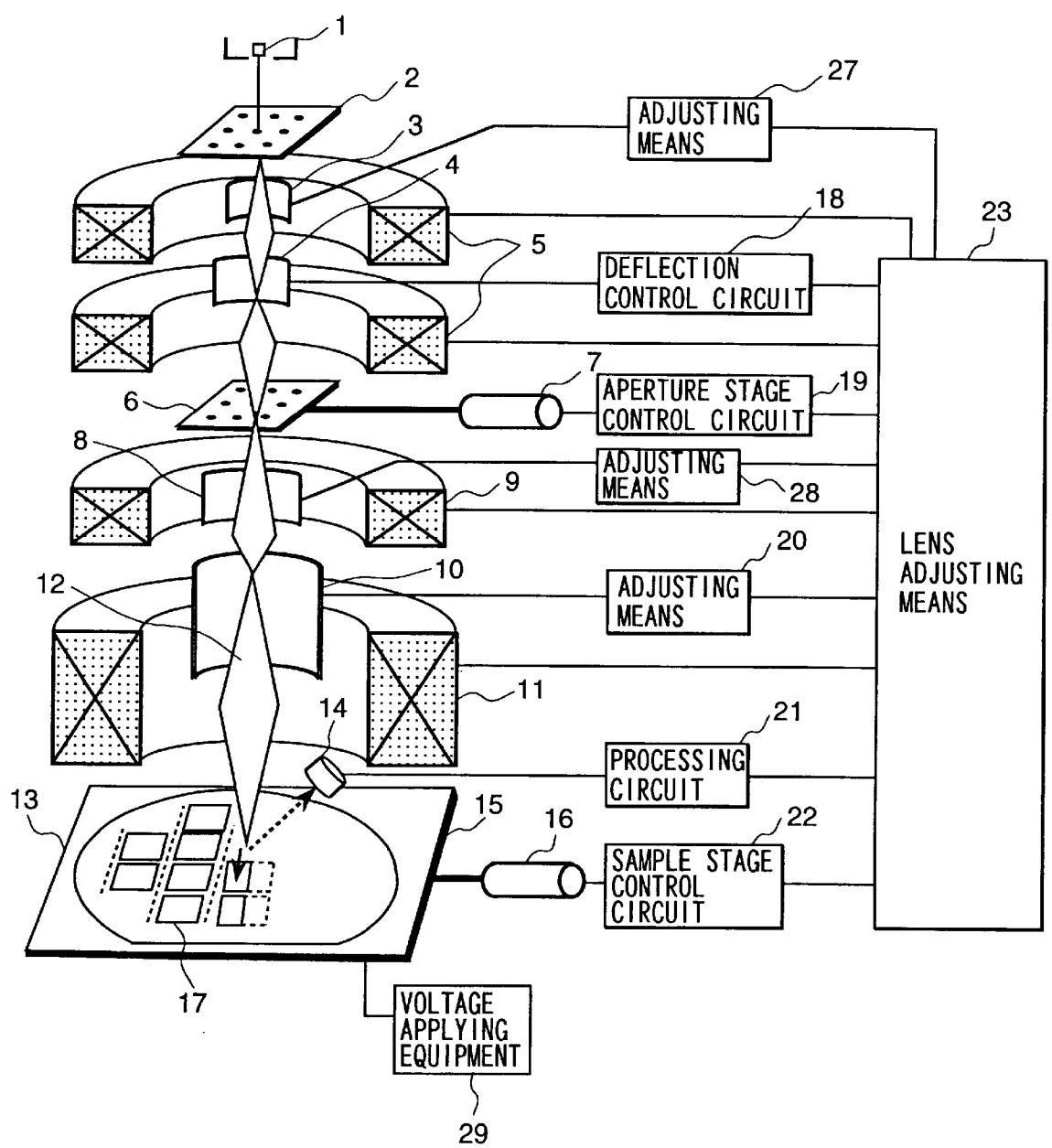
FIG. 1 is a perspective view for showing a schematic construction of the electron beam lithography equipment.
Figure 2:
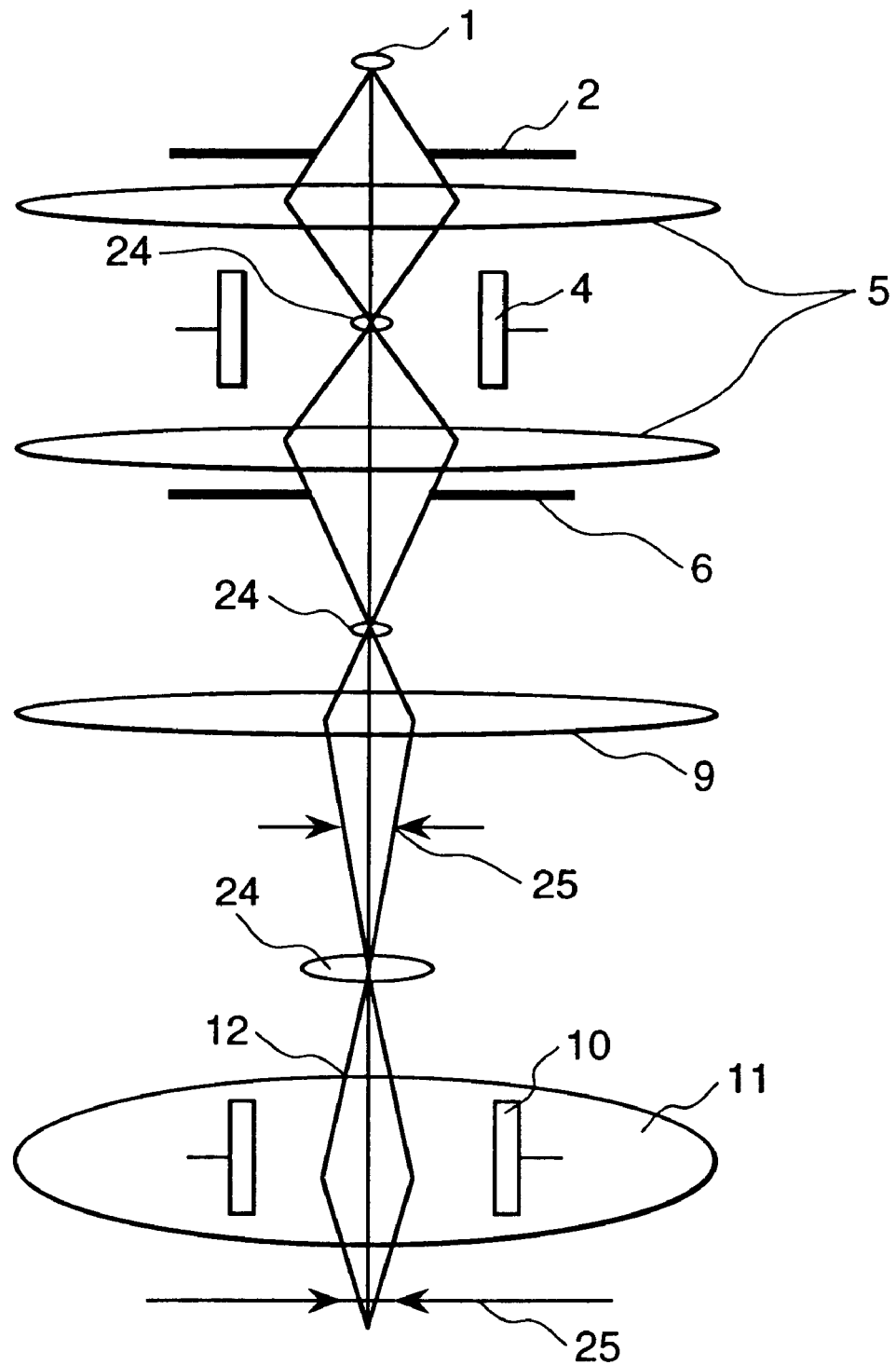
FIG. 2 is a partial enlarged view of FIG. 1 to show a locus of the electron beam.

In the schematic block diagram of an electron beam exposing apparatus shown by FIG. 1, and a chart of a locus of the electron beam shown by FIG. 2, the electron beam irradiated by an electron source 1 passes through a first shaping aperture 2 having a rectangular shape, and is focused on a second shaping aperture 6 by two-element optical lens 5. A rectangular aperture is arranged on the second shaping aperture 6 in the same way, an image location in the first shaping aperture 2 is controlled by the shaping deflector 4, and a shaped beam 12 is formed.

Here, the respective shaping apertures are needed to fit to an axis center of the shaping lens in order to make electronic optics aberration a minimum. In FIG. 1, the transmitted beam of the first shaping aperture 2 is moved to the axis center of the shaping lens 5 with a shaping axis adjusting deflector 3. Furthermore, a shaping aperture stage driving device 7, to move the second shaping aperture 6, is automatically used.

The shaped beam 12 that occurs is reduced one to dozens of times by a reducing lens 9, and is introduced to an objective lens 11. The shaped beam image focused by the objective lens 11 on the sample 15 on a sample stage 13, is deflected so as to be projected to an exposing location in turn with the objective deflector 10 and the sample stage driving device 16, and a pattern 17 is exposed. An objective axis adjusting deflector 8 is employed by the present invention, and the function thereof will be explained in detail in the explanation of FIG. 3.

A control computer 23 controls, based on exposure data, a shaping deflection control circuit 18, an object deflection control circuit 20, a shaping axis adjusting deflection control circuit 27, an object axis adjusting deflection control circuit 28, and a sample stage control circuit 22. In a batch exposure system, a desired shape aperture is selected by a shaping aperture stage control circuit 19.

By scanning the calibration mark arranged on the sample stage 13 with the objective deflector 10, the beam is calibrated from a marking signal wave-form provided with mark detection device 14, which detects a reflected electron beam, by detecting the beam location with a signal processing circuit 21.

FIG. 2 shows a lens focusing relation in the construction shown in FIG. 1. The image strength in FIG. 2 is different from an actual case in order to facilitate the explanation.

A shaping aperture image 25 is projected to be reduced on the sample 15 by a reducing lens 9 and an objective lens 11. On the other hand, the electron source image 24 is focused on a center of the shaping deflector 4, and is enlarged in turn with the lower lens. Here, if the setting accuracy of the shaping lens 5 is not high enough and the electron source image 24 is not focused on the center of the shaping deflector 4, the magnified electron source image arranged lower is focused to deviate from the beam axis by an actuation of the shaping deflector 4. Thereby, the incidence location to the objective lens 11 focuses so as to be deviated based on a setting of the shaping dimension, and any inconvenience such as location distortion or difference occurs in the shaping aperture image obtained finally through the effect of the aberration of the objective lens 11.

Figure 3A:
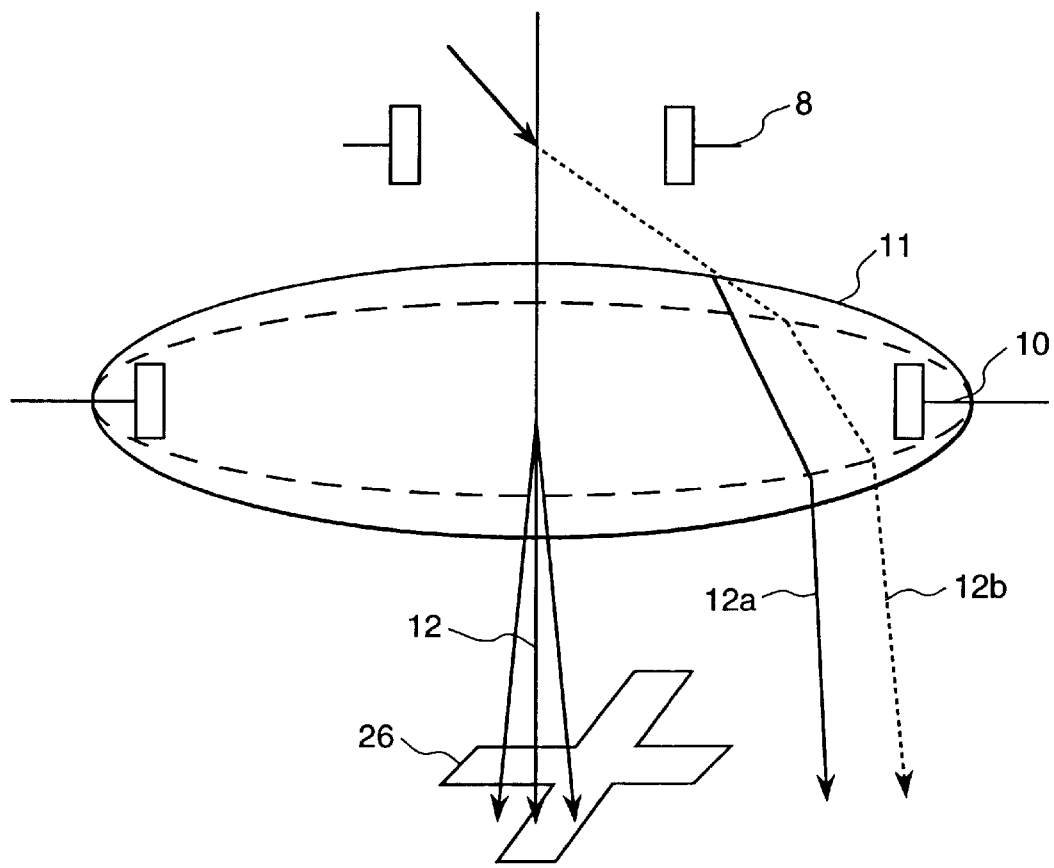
FIGS. 3A, 3B, 3C are partial enlarged views of FIG. 2 for explaining a principle in the present invention.
Figure 3B:
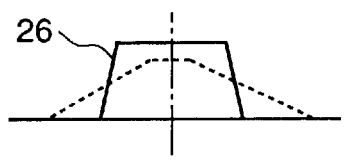
Figure 3C:
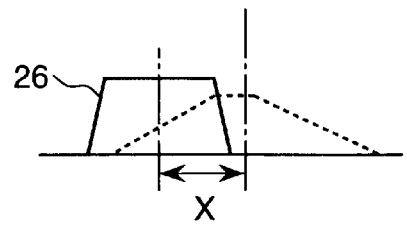

FIGS. 3A, 3B, 3C are partial enlarged views of FIG. 2 for explaining the principle of the present invention.

FIG. 3A shows a case where the shaped beam 12 scans the calibration mark 26 on or outside the axis of the objective lens 11, and furthermore shows a case where the strength of objective lens 11 is at a focused point location and is varied therefrom. In FIGS. 3B, 3C, the, calibration mark 26 is shown by a solid line and a scan waveform having scanned the calibration mark 26 is shown by a dashed line.

In FIG. 3B, when the strength of object lens 11 is set so as to be at a focal point position and the shaped beam 12 passes through the center of the object lens 11, if the strength of the object lens 11 becomes weak, the scan waveform on the calibration mark 26 becomes a broken line. However, a location deviation does not occur.

On the other hand, in FIG. 3C, where the shaped beam 12a goes through outside of the axis of the object lens 11 shown in FIG. 3A, as shown by a locus of the shaped beam 12b, if the strength of the object lens 11 is changed from the focal point location, a location deviation X occurs as shown in the FIG. 3C.

An objective axis adjusting of deflector 8 is used in order to correct this location difference X. Generally, when a quantity of the location difference is very small, the location difference X is in proportion to an amount of the location difference. The location difference X is defined as a two-dimensional coordinate (Xi, Yj), herein after. Here, the codes i, j are defined considering a difference of the setting parameter.

Output (Ui, Uj) of the object axis adjusting deflector 8 is set by the two-dimensions in their X, Y directions, the location difference of the variable dimension (W, H) of the beam by the respective shaping aperture (Xi, Yp) is expressed with a linear expression of the output (Ui, Uj), and the output (Uio, Ujo) is obtained so as to satisfy a relation as the location difference (Xi, Yj)=0. When the output of the object axis adjusting deflector 8 (Ui, Uj) is set so as to satisfy the value of the output (Uio, Ujo), the location difference can be zero.

The dispersion or the drift spreading of the output (Uio, Ujo) increases and decreases according to the setting of the shaping lens 5. Accordingly, a shaping lens parameter that the dispersion of a variable amount $(Uio^2+Ujo^2)^{1/2}$ by each dimension of the variable dimension(W, H) of the beam by each shaping aperture becomes minimum should be set. Furthermore, if the setting value of the objective axis adjusting deflector 8, is set to be a mean value of the output (Uio, Ujo), the influence of the axis difference can be in minimum.

Figure 4:
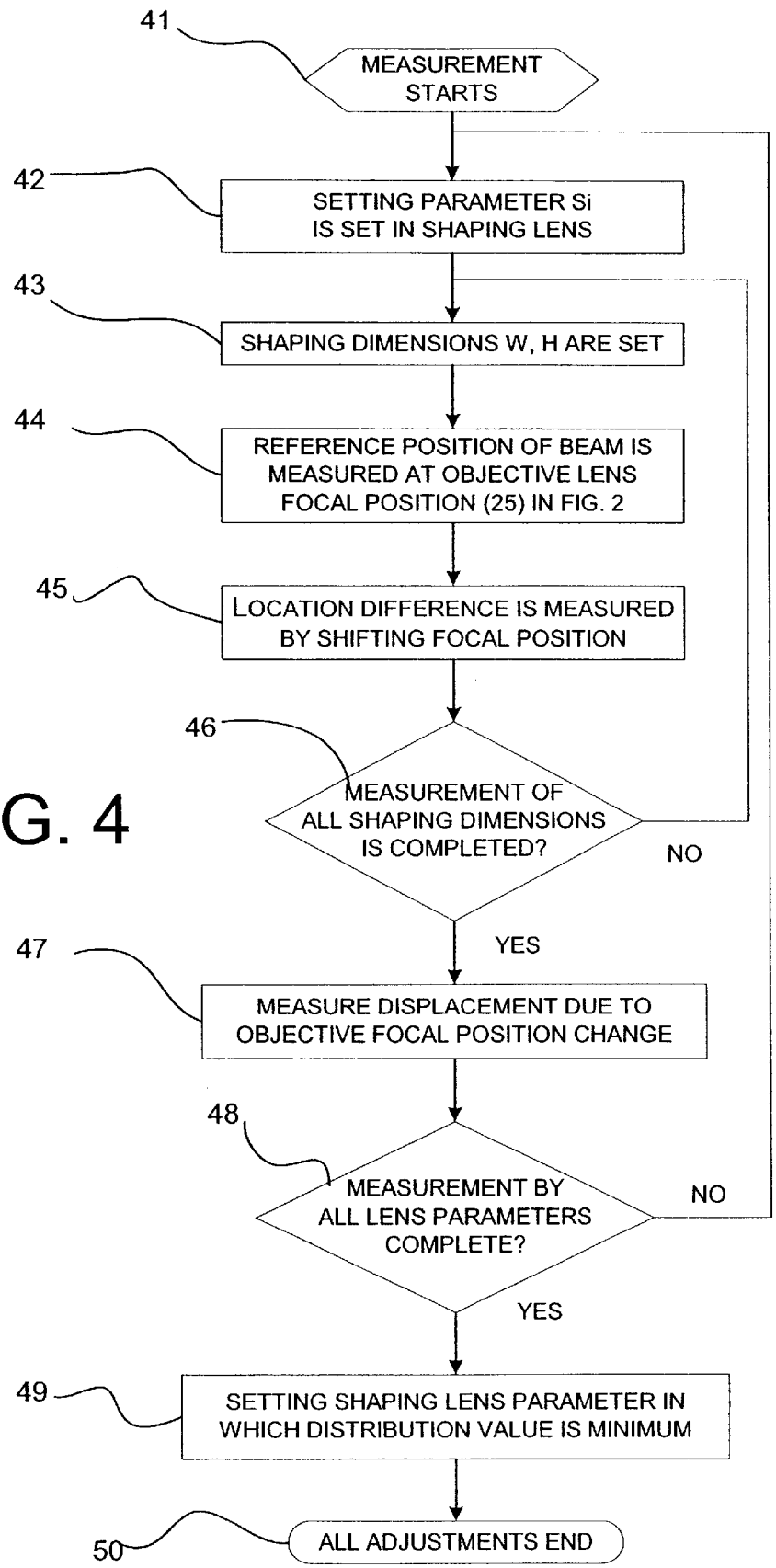
FIG. 4 is a flow chart for showing steps for setting of a shaping lens parameter.

FIG. 4 is a flow chart for showing steps for setting of a shaping lens parameter. The amount of the axis difference for each shaping dimension is obtained by varying the object lens strength. At first, in a step 41, Measurement of the location difference of the beam is started. A setting parameter Si is set for the shaping lens, which should be coordinated in a step 42 secondly in turn. In a step 43, the shaping dimensions W, H are set, and in a step 44, a reference position of the beam is measured at a focal location of the beam. In a step 45, the location difference of the beam is measured by shifting the focal position. In a step 46 for judging in the next place, after measurement of all of the shaping dimensions is completed, dispersion of the location difference value or dispersion of the output value being the most suitable one of the object axis adjusting deflector is calculated in a step 47. In a step 48 for judging, after measurement by all lens values is completed, the distribution value is expressed by a polynomial approximation of the shaping lens setting parameter in a step 49, and a shaping lens parameter that the dispersion becomes minimum is set. In a step 50, a deflection amount of the beam is coordinated and all steps are finished.

In the embodiment mentioned above, the strength of the object lens is changed, and it is capable of correcting the location difference in the same way by changing the accelerating voltage equivalently. In this case, a negative voltage is applied on the sample 15 on the sample stage 13 shown in FIG. 1 by a voltage applying equipment 29, and is changed. In addition, in the embodiment mentioned above, the shaping lens is corrected by measuring the axis difference with the variable shaping operation. This invention is effective for an aperture location difference for the shaping deflector or aberration of the electron source image caused by an axis difference incidence from the electronic source too. As such distortion etc. of the electron source image causes an axis difference and a beam distortion on the sample surface there are many cases that can be sensed as the location difference of the beam as mentioned in the above embodiment. Accordingly the present invention can be applied to such a problem by adjusting with the above-mentioned shaping aperture stage or the shaping axis adjusting deflector.

In this way, the present invention makes the provision of a high resolution beam adjusting method of a variable shaping type electron beam exposure apparatus possible, and a transcription distortion occurring in the objective lens or a transcription location difference is reduced by preventing the axis difference of the beam generated with a variable shaping operating. Thereby, a highly precise pattern exposure becomes possible. In addition, as an automatic regulation of the variable shaping type electron optics series equipment, which is difficult conventionally, becomes possible, an adjusting working after replacing the shaping aperture is simplified, and an operating ratio of the equipment in a manufacturing process of the semiconductor device is improved.

As mentioned above, according to the present invention, an electron beam exposure apparatus and an exposing method using an electron beam that realizes highly precise pattern exposure are obtained by preventing an axis difference generated by the variable shaping operation.

What is claimed is:

1. An exposing method using an electron beam for exposing a predetermined pattern by scanning a sample with an electron beam focused with a lens, comprising:

generating an electron beam with an axis and having an arbitrary cross-section by projecting said electron beam onto plural shaping apertures, detecting first reflected electrons which are generated by scanning a reference mark on said sample with a shaped beam generated by said beam shaping means, determining a reference location of the beam based on first location information of said beam provided from said first reflected electrons, shifting the axis of said beam from a focal location of said lens, and detecting second reflected electrons generated by scanning said reference mark on said sample, measuring a location difference due to said shifting of said focal point of said lens of said beam based on second location information of said beam provided from said second reflected electrons, and obtaining an adjusting parameter of said lens and adjusting said lens so as to make dispersion of said location difference minimum.

2. An exposing method using an electron beam for exposing a predetermined pattern by scanning a sample with an electron beam focused with a lens as defined in claim 1, comprising:

measuring a location difference of the electron beam on said sample by changing a adjusting parameter of said lens, and changing said adjusting parameter of said lens based on a value of said location difference of the electron beam.

3. An exposing method using an electron beam for passing through a shaping aperture with an electron beam, focusing the electron beam with a lens, and exposing a predetermined pattern on a sample by scanning on said sample is defined in claim 1, said method characterized by comprising the steps of measuring a location difference of said electron beam on said sample by changing a cross-section of said electron beam by exchanging said shaping aperture, and changing an adjusting parameter of said lens based on said location difference of said electron beam.

* * * * *